US012672261B2

(12) United States Patent
Zhu et al.

(10) Patent No.: US 12,672,261 B2
(45) Date of Patent: Jun. 30, 2026

(54) EASILY RECYCLABLE THERMOPLASTIC HOUSING

(71) Applicant: Covestro Deutschland AG, Leverkusen (DE)

(72) Inventors: Meiying Zhu, Shanghai (CN); Jiru Meng, Shanghai (CN); Guanghui Wu, Shanghai (CN)

(73) Assignee: Covestro Deutschland AG, Leverkusen (DE)

( * ) Notice: Subject to any disclaimer, the term of this patent is extended or adjusted under 35 U.S.C. 154(b) by 382 days.

(21) Appl. No.: 18/272,172

(22) PCT Filed: Dec. 29, 2021

(86) PCT No.: PCT/EP2021/087761
§ 371 (c)(1),
(2) Date: Jul. 13, 2023

(87) PCT Pub. No.: WO2022/152560
PCT Pub. Date: Jul. 21, 2022

(65) Prior Publication Data
US 2024/0107713 A1 Mar. 28, 2024

(30) Foreign Application Priority Data
Jan. 14, 2021 (WO) ................ PCT/CN2021/071804
Feb. 4, 2021 (EP) .................................... 21155223

(51) Int. Cl.
*H05K 7/20* (2006.01)
*H05K 5/00* (2025.01)
*H05K 5/10* (2025.01)

(52) U.S. Cl.
CPC ........... *H05K 7/20436* (2013.01); *H05K 5/10* (2025.01)

(58) Field of Classification Search
CPC ............................ H05K 7/20436; H05K 5/10
See application file for complete search history.

(56) References Cited

U.S. PATENT DOCUMENTS 2,891,920 A 6/1959 Hyde et al.
2,991,273 A 7/1961 Hechelhammer et al.
2,999,825 A 9/1961 Floyd et al.
2,999,846 A 9/1961 Schnell et al.
3,028,635 A 4/1962 Schnell et al.
3,148,172 A 9/1964 Fox et al.
3,271,367 A 9/1966 Schnell et al.
3,294,725 A 12/1966 Findlay et al.
3,692,744 A 9/1972 Rich et al.
4,086,212 A 4/1978 Bier et al.
4,107,149 A 8/1978 Bier et al.
4,176,224 A 11/1979 Bier et al.
4,806,593 A 2/1989 Kress et al.
4,812,515 A 3/1989 Kress et al.
4,859,740 A 8/1989 Damrath et al.
4,861,831 A 8/1989 Damrath et al.
4,888,388 A 12/1989 Hongo et al.
4,982,014 A 1/1991 Freitag et al.
5,807,914 A 9/1998 Obayashi et al.
6,228,973 B1 5/2001 McCloskey et al.
6,375,026 B1 * 4/2002 Sheldrake ........... H04M 1/0249 29/525.01
2002/0166682 A1 * 11/2002 Watchko .............. H05K 9/0045 174/394
2003/0066672 A1 * 4/2003 Watchko ................... C23C 4/00 174/50
2004/0198247 A1 * 10/2004 Jokinen ............... H04M 1/0283 455/90.1
2006/0114646 A1 * 6/2006 Koibuchi ............ H04M 1/0237 361/600
2007/0230155 A1 * 10/2007 Christol ............... H05K 9/0067 361/816
2008/0015934 A1 * 1/2008 Kim ........................ H04M 1/22 705/14.14
2008/0146293 A1 * 6/2008 Kim .................... H04M 1/0252 455/575.1
2013/0134848 A1 * 5/2013 Chu ...................... F16B 21/073 312/265
2014/0078710 A1 * 3/2014 Choung ................ G06F 1/1658 361/818

(Continued)

FOREIGN PATENT DOCUMENTS

DE 1031512 6/1958
DE 1900270 11/1969
DE 1570703 2/1970
DE 2036052 A1 1/1972

(Continued)

OTHER PUBLICATIONS

Bonenberger, The First Snap-fit Handbook—Creating and Managing Attachment for Plastics Parts, Third Edition, 2016, Carl Hanser Verlag, München: 2016.
Freitag et al., Bayer AG, Polycarbonates, Encyclopedia of Polymer Science and Engineering, 1998, p. 648-718, vol. 11, Second Edition.
Grigo et al., Polycarbonate, Engineering Thermoplastics, Polycarbonate, Polyacetale, Polyester, Celluloseester, Kunststoff-Handbuch, 3/1, 1992, p. 117-299, Becker/Braun.

(Continued)

*Primary Examiner* — Michael A Matey
(74) *Attorney, Agent, or Firm* — The Webb Law Firm

(57) ABSTRACT

The invention relates to a housing assembly based on polycarbonate material, of which at least the front cover and the back cover are easily recyclable due to its separability into different parts for all components which are attached to the front cover or the back cover and which cannot be recycled together with the front cover or the back cover, respectively. Snap-fits, interference-fits, predetermined breaking points and other means are used for an easily detachable, but for use safe connection of the single parts.

14 Claims, No Drawings

(56) References Cited

U.S. PATENT DOCUMENTS

| | | | | |
|---|---|---|---|---|
| 2014/0218878 A1* | 8/2014 | Choi | H04M 1/0262 | 361/752 |
| 2014/0268623 A1* | 9/2014 | Kim | H04M 1/0249 | 361/809 |
| 2015/0069290 A1* | 3/2015 | Guo | C08L 83/10 | 252/75 |
| 2020/0007669 A1* | 1/2020 | Kwon | H04M 1/0264 | |

FOREIGN PATENT DOCUMENTS

| | | | |
|---|---|---|---|
| DE | 2063050 | | 7/1972 |
| DE | 2211956 | | 10/1973 |
| DE | 2507674 | A1 | 9/1976 |
| DE | 2507776 | A1 | 9/1976 |
| DE | 2715932 | A1 | 10/1978 |
| DE | 3631539 | A1 | 3/1988 |
| DE | 3631540 | A1 | 3/1988 |
| DE | 3704655 | A1 | 8/1988 |
| DE | 3704657 | A1 | 8/1988 |
| DE | 3832396 | A1 | 2/1990 |
| EP | 0430134 | A2 | 6/1991 |
| EP | 0517044 | A2 | 12/1992 |
| EP | 1841306 | A1 | 10/2007 |
| FR | 1561518 | | 3/1969 |
| GB | 1122003 | | 7/1968 |
| GB | 1229482 | | 4/1971 |
| GB | 1341318 | | 12/1973 |
| GB | 1367790 | | 9/1974 |
| JP | 6162039 | A | 3/1986 |
| JP | 6162040 | A | 3/1986 |
| JP | 61105550 | A | 5/1986 |
| WO | 2015052106 | A2 | 4/2015 |
| WO | 2021009103 | A1 | 1/2021 |

OTHER PUBLICATIONS

Schnell, Chemistry and Physics of Polycarbonates, 1964, vol. 9, Interscience Publishers, Germany.

* cited by examiner

EASILY RECYCLABLE THERMOPLASTIC HOUSING

CROSS-REFERENCE TO RELATED APPLICATIONS

This application is the United States national phase of International Application No. PCT/EP2021/087761 filed Dec. 29, 2021, and claims priority to International Application No. PCT/CN2021/071804 filed Jan. 14, 2021 and European Patent Application No. 21155223.7 filed Feb. 4, 2021, the disclosures of which are hereby incorporated by reference in their entireties.

BACKGROUND OF THE INVENTION

Field of the Invention

The invention relates to a housing assembly for an EE (electrical/electronic) device, the housing assembly comprising a back cover and a front cover made from polycarbonate material and at least one integrated electric/electronic component in heat-conductive communication with a heatsink element.

Description of Related Art

Housings made from thermoplastic materials are known and widely used, in particular in the EE sector. Compared to metal, thermoplastic materials offer lightweight solutions with remarkable design opportunities. Housings which are used today shall offer intelligent solutions for integration of multiple functions in one part, shall be slim and depending on the application easy portable. The devices shall have high power which often requires effective heat management.

Plastics are widely used due to their advantages, but nevertheless there is a negative perception with regard to waste generation. Especially in short lifecycle EE applications, such plastic housings contribute to the waste generated by such devices after their end of use. To save our resources and to protect the environment it becomes more and more important to use sustainable solutions and to promote a circular economy. Hence, it must be an aim to recycle as much plastic material as possible. One important step on this way is to make most of the material of housing assemblies available for a new cycle of use.

SUMMARY OF THE INVENTION

Hence, it is an object of the present invention to provide a housing assembly with an improved recyclability.

It has now been found that, surprisingly, the object is achieved by a housing assembly comprising a back cover and a front cover, wherein the back cover and the front cover each comprise a substrate layer made from the same polycarbonate material or different polycarbonate materials, and wherein a heatsink element is disposed on that side of the back cover which is directed to the interior of the housing, meaning disposed on the inside of the back cover of the housing, the heatsink element being in heat-conductive communication with at least one electric/electronic component, characterized in that the back cover and the front cover are connected with each other and detachable from each other via one or more fasteners selected from the group consisting of snap-fits, interference-fits, screw connections, and combinations thereof, formed from polycarbonate material, and/or one or more fasteners not formed from polycarbonate material, but which can be detached from the front and the back cover without any breaking of material or via predetermined breaking points and/or one or more predetermined breaking points, and that the at least one electric/electronic component and any other component attached to the front cover and/or to the back cover comprising a material which is not a polycarbonate material are removable from the respective cover part via snap-fit, interference-fit, screw connection or via breaking of a predetermined breaking point.

DESCRIPTION OF THE INVENTION

"Formed from polycarbonate material" here means, that the snap-fit, interference-fit, screw-connection consists of one or more polycarbonate materials.

"Via snap-fit, interference-fit, screw connection or via breaking of a predetermined breaking point" in the sense of the present invention means that not only one of each of these of connection means may form the connection of one component to another, but also two or more, from the same sub-group or different sub-groups, so it is understood as "at least one". Hence, also a combination of different connection means may be used for the connection of one component to another element, for example a snap-fit together with a screw-connection.

Preferably, the front cover and the back cover are attached to each other by predetermined breaking points or by separable snap-fits integrally formed from the respective cover part or by interference-fit, also preferably integrally formed.

The heatsink element is in heat-conductive communication with at least one electric/electronic component. "In heat-conductive communication" means that the heat originating from the electric/electronic component under use condition is partly or fully dissipated by the heatsink element, wherein the heatsink element is intended for heat transportation. The heatsink is a passive heat exchanger that transfers the heat generated by the electric/electronic component away from the electric/electronic component, dissipating the heat away from the core of the assembly, thereby allowing regulation of the device's temperature. The heat transport and hence the heat-conductive communication from the electric/electronic component to the heatsink element is not limited to heat conduction, but can in particular also be thermal radiation.

Such a housing assembly can be easily manually disassembled and separated into the different parts for further recycling steps, making a large share of the plastic material used available again for recycling, although different functions can be integrated in the device. As there are no parts consisting of or comprising another material than a polycarbonate material, preferably no parts consisting of or comprising another material than that of the front cover or the back cover, attached to the front cover or the back cover in such a way that separating them from the front cover or the back cover would require a breaking or other destruction of elements, except from predetermined breaking points, the front cover and the back cover of the housing assembly which are made from a thermoplastic material can be easily recycled. Components which comprise a different material than a polycarbonate material, preferably components that comprise a material which is different from the material of the cover part (front or back) to which the component is attached, which includes at least the one electric/electronic component which is in heat-conductive communication with the heatsink, are easily manually or automatedly separable from the front cover and/or the back cover without any breaking of material except via predetermined breaking points and can be disposed or themselves brought to proper recycling. This can be achieved by using snap-fits, interference-fits, screw connections or predetermined breaking points.

A snap-fit as understood in the present invention is a connecting means where flexible parts, here preferably only thermoplastic parts, are attached to each other by pushing the parts' interlocking components ("snap-fit elements") together. It is also understood for a manually or automatedly detachable connection between a metal part and a thermoplastic part where the elasticity of the thermoplastic part is sufficient to use this type of connection. The design of snap-fits is known to the person skilled in the art and is, e.g., described in "The First Snap-fit Handbook—Creating and Managing Attachment for Plastics Parts ($3^{rd}$ Ed.), Paul R. Bonenberger, München: 2016, ISBN: 978-1-56990-595-1. The snap-fit may be separable or not separable. However, if a snap-fit is used for the housing assembly according to the present invention, where parts shall be disassembled, the snap-fit is separable, meaning manually or automatedly openable without any breaking of material. It may happen, however, during opening of the snap-fit, that it breaks nevertheless, against what was foreseen. It is also understood within the sense of the invention that where a material different than a polycarbonate material, in particular metal, is used for a component of the snap-fit, this component of the snap-fit can also be easily detached from the front cover or the back cover, respectively, as it is then itself removable from the respective cover part via snap-fit, screw connection or via breaking of a predetermined breaking point. There may also snap-fits be used as part of the functional components, which do not serve as attachment means to the front cover or to the back cover. Those snap-fits may be separable or not separable, the separable ones being preferred.

There are various snap-fits, e.g. cantilever, torsional and annular. Most snap-fit connections are similar, having a protruding part and a snap-in area as mating part (examples for "snap-fit elements"). The cantilever snap-fit often has a lever, hook or pin to be pushed in order to do the snap-fit. The cantilever beam may also be of more complex shape, e.g. U-shaped or L-shaped. The torsional snap-fit uses torque to hold parts in place. The annular snap-fit uses hoop-strain to hold parts in place. Cantilever is the most preferred snap-fit for the connecting means in the present invention. Snap-fits may be hidden within an assembly or visible and easily accessible. According to the present invention, the snap-fits preferably are visible/accessible in order to allow easy disassembly, wherein it is of course understood that snap-fits positioned at the inner surfaces of the housing can in most cases only become visible/accessible after separation of the front cover and the back cover.

Snap-fits are also the preferred connecting means for the firmly, but separable connection of the front cover and the back cover, cantilever being most preferred. This allows a good connection between both cover parts without the need to use any adhesives, metal components such as screws and metal inserts, or other connecting means comprising or consisting of a different material than a polycarbonate material, preferably different polycarbonate material than used for the respective cover part, for connection of the cover parts. Preferably, the front cover and the back cover are free from such connecting means.

Preferably, the snap-fit elements of the back cover, of the front cover, the electric/electronic components and/or of any other functional components, which are detachably attached to the front cover or back cover, are integrally formed from the respective element to which they are firmly, not removable without breaking attached and which they shall connect to another element. "Integrally formed" in the context of the present invention means made of a single piece or formed into a single piece. The structural parts are then not connected by use of any additional connecting means such as adhesives, but the material of the snap-fit element and e.g. the material of the front cover or the back cover are attached to each other directly. This can be done by using the same material for the snap-fit element and the cover part and forming the cover part and the snap-fit element in one-component (1K) injection moulding. It also can be done by using a two-component (2K) injection moulding process. Preferably, the material from which the snap-fit element is formed is the same as that of the plastic part, e.g. the substrate layer of the front cover or the back cover, with which it is integrally formed. This also allows for better recyclability.

Other fasteners than snap-fits are in particular screws. In principle, screws can be made from metal as well and then be separated from the thermoplastic material which shall be recycled, but screws, when used, can also be made from thermoplastic material, which is preferred, and more preferably made from a polycarbonate material. Screws, however, are not the preferred connection means for the separable connections means in the present invention, although in principle screws can be used.

Fasteners such as snap-fits used in the housing assembly according to the invention may be formed of polycarbonate material, but the fasteners can also be formed from one or more materials different than a polycarbonate material. Such fasteners are preferably attached to the front cover or the back cover via separable connecting means such as separable snap-fits themselves or via predetermined breaking points, preferably predetermined breaking points which may not easily separated manually, but by machine.

Interference-fits, also known as press-fits, force fits or shrink fits, are similar to snap-fits, but while the snap-fits comprise two different, specifically for the snap-fit formed snap-fit elements which interlock which each other, the interference-fit comprises a shaft and a hub/a hole into which the shaft firmly fits and these elements are joined by a dimensional interference between the outside diameter of the shaft and the inside diameter of the hub. Forces which may be relevant in an interference fit are press force, friction force and hydraulic force. In the present invention, interference-fits may be used to detachably join the front cover to the back cover and/or detachably attach one or more electric/electronic component(s) and/or any other functional components to the front cover or to the back cover.

Preferably, if interference-fits are used, the interference-fit elements of the back cover, of the front cover, the electric/electronic components and/or of any other functional components, which are detachably attached to the front cover or back cover, are integrally formed from the respective element to which they are firmly, not without breaking attached and which they shall connect to another element.

A predetermined breaking point is a site determined by a special structure, shape or construction (usually a material rejuvenation) that breaks predictably in the event of stress or overload. For example, this can be a notch, a perforation or a score. Due to the notch effect, the component is significantly weakened. The predetermined breaking point according to the present invention is dimensioned such that the disassembly of the housing and/or functional components can be achieved manually or automatedly.

Predetermined breaking points may be applied in the housing assembly according to the invention, where material for connecting means is used which is not a polycarbonate material or also where a polycarbonate material is used which shall be separated from the material of the front cover/back cover. The predetermined breaking point may be used where a functional component made from a different material than a polycarbonate material is directly attached to the substrate layer of the front cover or of the back cover. It may be also used if a connecting means/a part of a connecting means directly attached to the substrate layer of the front cover or of the back cover is made from a different material than a polycarbonate material to easily separate the connecting means/the respective part of the connecting means from the substrate layer of the respective cover part. Moreover, predetermined breaking points may be also used in the housing assembly according to the invention for an easy separation of two parts made from a polycarbonate material, but which have to be separated for recycling purposes. One example is one or more predetermined breaking points between the front cover and the back cover, even when made from polycarbonate material, as both parts have to be separated at least for removal of the components from the inner of the housing assembly, although, depending on the polycarbonate materials used for the front cover and the back cover, a final recycling of both cover parts together might be possible. Another example is where an internal housing element which shall fully or close to fully surround an electric/electronic component is attached to the inner surface—the surface directed to the inner of the housing—of the front cover or of the back cover. For removal of the electric/electronic component, the inner housing element has to be separated from the front cover, respectively from the back cover.

For recycling purposes, all components which comprise a material that is not a polycarbonate material, preferably all components that comprise a material which is not the polycarbonate material of the substrate layer of the front cover or back cover, depending on which cover part the respective component is attached to, are manually or automatedly removable from the respective cover part without breaking or willful destruction of any material, e.g. by cutting, except from the material at predetermined breaking points. In EE devices, the electric/electronic components usually comprise metal or multiple-materials solutions. Or the housing assembly comprises different thermoplastic materials which cannot be recycled together with the material of the front cover or the back cover. Such parts are at present either not recyclable themselves or at least not recyclable together with the front cover and the back cover. Such components are for example functional components, such as electric/electronic components, preferably one or more, in case of "more" also selected from the same species—so "at least one from the same species"—, selected from the group consisting of an antenna, a printed circuit board, a light-emitting diode (LED), respectively an LED comprising component, e.g. in form of an LED module, a resistor, a constant current driver, a driver/controller, a display element, a capacitor, a power supply unit, a port for a power supply, ethernet, HDMI, audio ports, display ports, a Bluetooth module, a GPS module, a microprocessor, an integrated circuit, a photocell, a piezo-transducer, an inductor, a proximity switch, a USB (port), a microphone, a sensor, a touch screen as well as components having a structural or optical effect or changing the haptic, or having any other effect in the assembly, so also functional components—"other functional components than electric/electronic components"—such as light windows made from material being translucent or transparent for the visible light, "transparent" preferably meaning a transmission Ty of at least 80%, more preferably of at least 85%, particularly preferred of at least 90%, determined according to DIN EN ISO 13468-2:2006 (D65, 10°), and preferably in addition thereto a haze of less than 2.0%, more preferably of less than 1.0%, particularly preferred of less than 0.8%, determined according to ASTM D1003:2013, each determined at the respective thickness of the light window, "translucent" preferably meaning a transmission Ty of $<85\%$, more preferably $<60\%$, and even more preferably at least 2.5%, further preferred $>2.5\%$, determined according to DIN EN ISO 13468-2:2006 (D65, 10°), and preferably a haze, determined according to ASTM D1003:2013 of $>5.0\%$ and more preferably $<80\%$ both determined at the respective layer thickness, or other kinds of windows such as for certain functionalities, e.g. signal transmission. Preferably, also such functional components are detachable from the substrate layer of the front cover or the back cover if those comprise polycarbonate material, which cannot be recycled together with the substrate layer of the respective cover part, more preferably, if those functional components comprise a polycarbonate material which is not the polycarbonate material of the substrate layer of the respective cover part. Functional components which comprise as core component metal-containing element, such as LED, PCB etc. can of course also comprise a housing themselves, which is regarded as part of the functional component. If there are several functional components attached to either the front cover or to the back cover, they may be attached to the respective substrate layer via a separate carrier, preferably made from polycarbonate material itself, either the same or a different polycarbonate material than that of the respective cover layer, wherein the carrier as such is detachable from the respective cover layer as described above. Preferably, in this case, each of the functional components comprising a material which is not a polycarbonate material are detachable from the carrier via snap-fits, interference-fits, screw-connections or predetermined breaking points leaving only polycarbonate material attached to the carrier, preferably only the same polycarbonate material as that of the carrier.

It should be noted that the "one or more"/"at least one" above not only relates to different members of the group of electric/electronic components, but can be also a selection of two or more from the same electric/electronic component species of the above-mentioned list, e.g. several LED comprising components or several printed circuit boards. A preferred combination of functional components which may be part of the housing assembly is an LED comprising component and a light window.

By attaching the functional components to a separate part or using them as a separate part which is removable from the front cover and/or the back cover without the destruction of any components, which can be realized, e.g., by snap-fits, interference-fits and/or by predetermined breaking points, the housing assembly can be manually or automatedly disassembled into its structural parts, which are at least front cover, back cover and functional elements, which can be brought to their further recycling steps, while a large part of the plastic material used in the housing assembly is regained for recycling.

If signal transmission is necessary, the front cover has to be made from a material which exhibits the necessary transmission. 3G and 4G applications usually require lower frequencies up to 2 GHz, while 5G applications require frequencies >2 GHz up to 6 GHz and >24 GHz.

The front cover and/or the back cover may comprise a window which is IR transmissive. "Being IR transmissive" is understood to mean a transmission in the range of 850 nm to 1100 nm, in particular in the range of 850 nm to 900 nm and/or 930 to 950 nm, of ≥50%, preferably ≥80% determined in accordance with DIN ISO 13468-2:2006 (the wavelength range used as described). Such an IR transmissive window may e.g. be useful where a remote control shall be used to control the electronics inside of the housing assembly or where an IR sensor is used.

Functional windows as e.g. an IR transmissive window, a window made from translucent material or a window made from for the observer transparent material, might be applied to the substrate layer of the front cover or of the back cover by snap-fit, interference-fit, 2K injection moulding or welding. If the window material can be easily recycled together with the material of the substrate layer to which it is attached, there is no need for a detachable attachment of the window to the substrate layer, so that the attachment via 2K injection moulding or welding is preferred. However, if a material is used for the window which requires separate recycling from the material of the substrate layer, then a separable snap-fit or interference-fit is the preferred attachment means. Consequently, if the material used for the window element is not a polycarbonate material, the window element is detachably attached to the cover part.

The functional components which can be part of the housing assembly can be disposed on the outer side of the housing—on the front and/or the back cover—, or in the interior of the housing, which is the room surrounded by the housing, formed mainly or in total by the front cover and the back cover, which is where the heatsink element is already present. Functional components can also be partly or fully integrated into the substrate layer of the front cover or back cover, saving room in the inner of the housing assembly or allowing smaller dimensions of the housing assembly than in case of placing the functional components only in the inner of the housing assembly, between the front cover and the back cover. In principle, the design could also intend to attach functional components that are manually or automatedly removable without any breaking of material or via predetermined breaking points only to one of the back cover or the front cover, and other functional components firmly, inseparable without breaking to the other cover part, but this would negatively influence the recyclability of the entire housing assembly, as then only one cover part could be easily recycled.

Preferably, the back cover and the front cover of the housing assembly each do not comprise any additional layers than layers made of polycarbonate material, more preferably not any additional layer than the substrate layer made from polycarbonate material and in case of the back cover a second layer made from polycarbonate material comprising the heatsink element integrally formed thereto, even more preferably not any additional layers than the one substrate layer made of polycarbonate material, most preferably only one polycarbonate material. Additional layers, which preferably are not part of the housing, are coating layers which are not polycarbonate based, e.g. such coating layers for scratch-resistance, printings, paintings, platings. There are, however, coating layers which can be used in an assembly according to the present invention. Such coatings are in principle those based on polycarbonate, in particular those based on the same polycarbonate as used for the substrate layer of the front cover or the back cover, respectively. A coating layer might be recyclable together with the substrate layer, either mechanically or chemically. A coating layer which fulfills this requirement is a polycarbonate based coating, e.g. polycarbonate ink obtainable under the trade name Noriphan® HTR from the company Pröll GmbH, Germany This ink contains a mixture of a polycarbonate resin and high temperature stable pigments dispersed in ethylbenzene, solvent Naphtha (light aromatic), 1,2,4-trimethylbenzene, xylene isomers, diacetone alcohol, mesitylene, n-butyl alcohol, and various esters. Additional layers made of a polycarbonate material, either of the same or of a different polycarbonate material than that of the respective cover part, might be applied to the substrate layer of the front cover or back cover. Most preferably, however, the front cover and the back cover do not comprise any additional layer applied onto the respective substrate layer. It is clear from the general understanding of the invention that structural elements such as window elements are not understood to be an "additional layer". Layers made from polycarbonate material having a design aspect, either with regard to haptics or to optical effects, might be applied as functional components and at the same time being an additional layer. However, as the substrate layers themselves might be changed at their surface for design effects and as any additional layer requires additional material, which requires resources, makes the device less slim and the weight of the device higher, the cover parts preferably comprise no additional layers than the substrate layers and, in case of the back cover, optionally a second layer from which integrally a heatsink element is formed.

According to the invention, "polycarbonate" is to be understood as meaning both homopolycarbonates and copolycarbonates, in particular aromatic ones. These polycarbonates may be linear or branched in known fashion. According to the invention, mixtures of polycarbonates may also be used.

A "polycarbonate material" or a material "based on polycarbonate" is a thermoplastic material preferably comprising at least 50 wt.-% polycarbonate, more preferably at least 60 wt.-% polycarbonate, even more preferably at least 65 wt.-% polycarbonate.

A portion, preferably up to 80 mol %, more preferably of 20 mol % to 50 mol %, of the carbonate groups in the polycarbonates used in accordance with the invention may have been replaced by aromatic dicarboxylic ester groups. Polycarbonates of this type that incorporate not only acid radicals derived from carbonic acid but also acid radicals derived from aromatic dicarboxylic acids in the molecular chain are referred to as aromatic polyester carbonates. For the purposes of the present invention, they are covered by the umbrella term "thermoplastic aromatic polycarbonates".

Replacement of the carbonate groups by the aromatic dicarboxylic ester groups proceeds essentially stoichiometrically and also quantitatively and the molar ratio of the reaction partners is therefore also reflected in the final polyester carbonate. The aromatic dicarboxylic ester groups can be incorporated either randomly or blockwise.

Polyestercarbonates are encompassed under the term "polycarbonates" in the sense of the present invention.

Preferred polyestercarbonates are represented by formula (i)

(i)

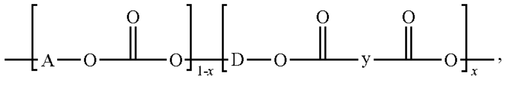

in which

A in each repeating unit mutually independently represents an aliphatic or aromatic divalent group, for example an aromatic divalent group which has 6 to 30 carbon atoms and may contain one or more aromatic rings, may be substituted and may contain aliphatic or cycloaliphatic radicals or alkylaryls or heteroatoms as bridging elements, such as a structure of formula (ii)

(ii)

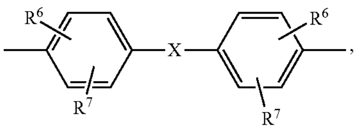

in which $R^6$ and $R^7$ are each independently H, $C_1$- to $C_{18}$-alkyl, $C_1$- to $C_{18}$-alkoxy, halogen such as Cl or Br or in each case optionally substituted aryl or aralkyl, preferably H or $C_1$- to $C_{12}$-alkyl, more preferably H or $C_1$- to $C_8$-alkyl and most preferably H or methyl, and X is a single bond, —$SO_2$—, —CO—, —O—, —S—, $C_1$- to $C_6$-alkylene, $C_2$- to $C_5$-alkylidene or $C_5$- to $C_6$-cycloalkylidene, which may be substituted by $C_1$- to $C_6$-alkyl, preferably methyl or ethyl, or else $C_6$- to $C_{12}$-arylene which may optionally be fused to further aromatic rings containing heteroatoms, or—referring to A—an aliphatic divalent group which may be cyclic, linear or branched comprising 2 to 30 carbon atoms which may be interrupted by at least one hetero atom and may comprise more than one cycle such as for example structure (iii)

(iii)

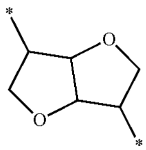

or—referring to A— a linear alkylene group having 2 to 22 carbon atoms, preferably 2 to 4 carbon atoms, which may be interrupted by at least one hetero atom, or a branched alkylene group having 4 to 20 carbon atoms, preferably 5 to 15 carbon atoms, which may be interrupted by at least one hetero atom or a cycloalkylene group having 4 to 20 carbon atoms, preferably 5 to 15 carbon atoms, which may be interrupted by at least one hetero atom and which may contain more than one cycle, D in each repeating unit mutually independently represents A or an aromatic or cycloaliphatic divalent group, preferably an optionally substituted phenylene or an optionally substituted cyclohexylene, y in each repeating unit mutually independently represents an aliphatic divalent group which may be cyclic, linear or branched comprising 2 to 30 carbon atoms which may be interrupted by at least one hetero atom and may comprise more than one cycle or an aromatic divalent group, preferably a linear aliphatic divalent group having 2 to 30 carbon atoms, a branched aliphatic divalent having 2 to 30 carbon atoms, a cycloaliphatic divalent group having 6 to 30 carbon atoms and which may comprise more than one cycle or an aromatic divalent group having 6 to 30 carbon atoms, more preferably an optionally substituted cyclohexylene, an aliphatic linear group having 2 to 18 carbon atoms or an optionally substituted phenylene and $0<x<1$.

Most preferred polyestercarbonates are those based on the combination of the following diols and diacids: bisphenol A and sebacic acid; bisphenol A and isophthalic acid, terephthalic acid and/or phthalic acid and optionally resorcinol; isosorbide and cyclohexane dicarboxylic acid and optionally further diols or diacids.

Aromatic polycarbonates selected in accordance with the invention preferably have weight-average molecular weights $M_w$ of 15 000 to 40 000 g/mol, more preferably of 16 000 to 34 000 g/mol, even more preferably of 17 000 to 33 000 g/mol, most preferably of 19 000 to 32 000 g/mol. The values for $M_w$ here are determined by a gel permeation chromatography, calibrated against bisphenol A polycarbonate standards using dichloromethane as eluent, calibration with linear polycarbonates (made of bisphenol A and phosgene) of known molar mass distribution from PSS Polymer Standards Service GmbH, Germany; calibration according to method 2301-0257502-09D (2009 Edition in German) from Currenta GmbH & Co. OHG, Leverkusen. The eluent is dichloromethane. Column combination of crosslinked styrene-divinylbenzene resins. Diameter of analytical columns: 7.5 mm; length: 300 mm Particle sizes of column material: 3 μm to 20 μm. Concentration of solutions: 0.2% by weight. Flow rate: 1.0 ml/min, temperature of solutions: 30° C. Detection using a refractive index (RI) detector.

The polycarbonates are preferably produced by the interfacial process or the melt transesterification process, which have been described many times in the literature.

With regard to the interfacial process reference is made for example to H. Schnell, "Chemistry and Physics of Polycarbonates", Polymer Reviews, Vol. 9, Interscience Publishers, New York 1964 p. 33 et seq., to Polymer Reviews, Vol. 10, "Condensation Polymers by Interfacial and Solution Methods", Paul W. Morgan, Interscience Publishers, New York 1965, Chapt. VIII, p. 325, to Dres. U. Grigo, K. Kircher and P. R- Müller "Polycarbonate" in Becker/Braun, Kunststoff-Handbuch, Volume 3/1, Polycarbonate, Polyacetale, Polyester, Celluloseester, Carl Hanser Verlag Munich, Vienna 1992, pp. 118-145 and also to EP 0 517 044 A1.

The melt transesterification process is described, for example, in the "Encyclopedia of Polymer Science", Vol. 10 (1969), Chemistry and Physics of Polycarbonates, Polymer Reviews, H. Schnell, Vol. 9, John Wiley and Sons, Inc. (1964), and in patent specifications DE 10 31 512 A and U.S. Pat. No. 6,228,973 B1.

Particulars pertaining to the production of polycarbonates are disclosed in many patent documents spanning approximately the last 40 years. Reference may be made here by way of example to Schnell, "Chemistry and Physics of Polycarbonates", Polymer Reviews, Volume 9, Interscience Publishers, New York, London, Sydney 1964, to D. Freitag, U. Grigo, P. R. Müller, H. Nouvertné, BAYER AG, "Polycarbonates" in Encyclopedia of Polymer Science and Engineering, Volume 11, Second Edition, 1988, pages 648-718, and finally to U. Grigo, K. Kirchner and P. R. Müller "Polycarbonate" in Becker/Braun, Kunststoff-Handbuch, Volume 3/1, Polycarbonate, Polyacetale, Polyester, Celluloseester, Carl Hanser Verlag Munich, Vienna 1992, pages 117-299.

The production of aromatic polycarbonates is effected for example by reaction of dihydroxyaryl compounds with carbonic halides, preferably phosgene, and/or with aromatic dicarboxyl dihalides, preferably benzenedicarboxyl dihalides, by the interfacial process, optionally using chain terminators and optionally using trifunctional or more than trifunctional branching agents, production of the polyester carbonates being achieved by replacing a portion of the carbonic acid derivatives with aromatic dicarboxylic acids or derivatives of the dicarboxylic acids, specifically with aromatic dicarboxylic ester structural units according to the carbonate structural units to be replaced in the aromatic polycarbonates. Preparation via a melt polymerization process by reaction of dihydroxyaryl compounds with, for example, diphenyl carbonate is likewise possible.

Dihydroxyaryl compounds suitable for the production of polycarbonates are for example hydroquinone, resorcinol, dihydroxydiphenyls, bis(hydroxyphenyl)alkanes, bis(hydroxyphenyl)cycloalkanes, bis(hydroxyphenyl) sulfides, bis (hydroxyphenyl) ethers, bis(hydroxyphenyl) ketones, bis (hydroxyphenyl) sulfones, bis(hydroxyphenyl) sulfoxides, α,α'-bis(hydroxyphenyl)diisopropylbenzenes, phthalimidines derived from derivatives of isatin or phenolphthalein and the ring-alkylated, ring-arylated and ring-halogenated compounds thereof.

Preferred dihydroxyaryl compounds are 4,4'-dihydroxydiphenyl, 2,2-bis(4-hydroxyphenyl)propane (bisphenol A), 2,4-bis(4-hydroxyphenyl)-2-methylbutane, 1,1-bis(4-hydroxyphenyl)-p-diisopropylbenzene, 2,2-bis(3-methyl-4-hydroxyphenyl)propane, dimethylbisphenol A, bis(3,5-dimethyl-4-hydroxyphenyl)methane, 2,2-bis(3,5-dimethyl-4-hydroxyphenyl)propane, bis(3,5-dimethyl-4-hydroxyphenyl) sulfone, 2,4-bis(3,5-dimethyl-4-hydroxyphenyl)-2-methylbutane, 1,1-bis(3,5-dimethyl-4-hydroxyphenyl)-p-diisopropylbenzene and 1,1-bis(4-hydroxyphenyl)-3,3,5-trimethylcyclohexane and also the bisphenols (I) to (III)

(I)

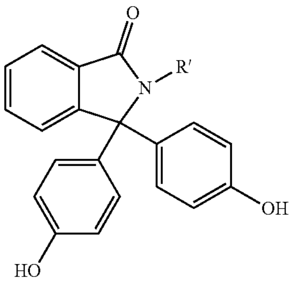

(II)

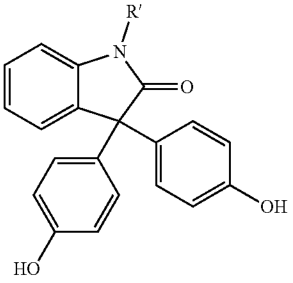

(III)

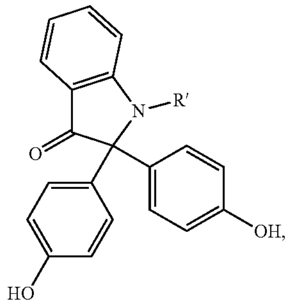

in which R' in each case stands for $C_1$- to $C_4$-alkyl, aralkyl or aryl, preferably for methyl or phenyl, very particularly preferably for methyl.

Particularly preferred dihydroxyaryl compounds are 2,2-bis(4-hydroxyphenyl)propane (bisphenol A), 2,2-bis(3,5-dimethyl-4-hydroxyphenyl)propane, 1,1-bis(4-hydroxyphenyl)cyclohexane, 1,1-bis(4-hydroxyphenyl)-3,3,5-trimethylcyclohexane, 4,4'-dihydroxybiphenyl, and dimethylbisphenol A and also the diphenols of formulae (I), (II) and (III).

These and other suitable dihydroxyaryl compounds are described for example in U.S. Pat. Nos. 3,028,635 A, 2,999,825 A, 3,148,172 A, 2,991,273 A, 3,271,367 A, 4,982,014 A and 2,999.846 A, in DE 1 570 703 A, DE 2063 050 A, DE 2 036 052 A, DE 2 211 956 A and U.S. Pat. No. 2,999,846 A, in DE 1 570 703 A, DE 2063 050 A, DE 2 036 052 A, DE 2 211 956 A and DE 3 832 396 A, in FR 1 561 518, in the monograph "H. Schnell, Chemistry and Physics of Polycarbonates, Interscience Publishers, New York 1964" and also in JP 62039/1986 A, JP 62040/1986 A and JP 105550/1986 A.

In the case of homopolycarbonates only one dihydroxyaryl compound is used; in the case of copolycarbonates two or more dihydroxyaryl compounds are used. The dihydroxyaryl compounds employed, similarly to all other chemicals and assistants added to the synthesis, may be contaminated with the contaminants from their own synthesis, handling and storage. However, it is desirable to use raw materials of the highest possible purity.

Suitable carbonic acid derivatives are for example phosgene and diphenyl carbonate.

Suitable chain terminators that may be used in the production of polycarbonates are monophenols. Suitable monophenols are for example phenol itself, alkylphenols such as cresols, p-tert-butylphenol, cumylphenol and mixtures thereof.

Preferred chain terminators are the phenols mono- or polysubstituted by linear or branched $C_1$- to $C_{30}$-alkyl radicals, preferably unsubstituted or substituted by tert-butyl. Particularly preferred chain terminators are phenol, cumylphenol and/or p-tert-butylphenol.

The amount of chain terminator to be employed is preferably 0.1 to 5 mol % based on the moles of diphenols employed in each case. The addition of the chain terminators may be effected before, during or after the reaction with a carbonic acid derivative.

Suitable branching agents are the trifunctional or more than trifunctional compounds familiar in polycarbonate chemistry, in particular those having three or more than three phenolic OH groups. Suitable branching agents are for example 1,3,5-tri(4-hydroxyphenyl)benzene, 1,1,1-tri(4-hydroxyphenyl)ethane, tri(4-hydroxyphenyl)phenylmethane, 2,4-bis(4-hydroxyphenylisopropyl)phenol, 2,6-bis(2-hydroxy-5'-methylbenzyl)-4-methylphenol, 2-(4-hydroxyphenyl)-2-(2,4-dihydroxyphenyl)propane, tetra(4-hydroxyphenyl)methane, tetra(4-(4-hydroxyphenylisopropyl)phenoxy) methane and 1,4-bis((4',4"-dihydroxytriphenyl)methyl) benzene and 3,3-bis(3-methyl-4-hydroxyphenyl)-2-oxo-2,3-dihydroindole. The amount of the branching agents for optional employment is preferably 0.05 mol % to 2.00 mol %, based on moles of dihydroxyaryl compounds used in each case. The branching agents may be either initially charged together with the dihydroxyaryl compounds and the chain terminators in the aqueous alkaline phase or added dissolved in an organic solvent before the phosgenation. In the case of the transesterification process the branching agents are employed together with the dihydroxyaryl compounds.

Particularly preferred polycarbonates are the homopolycarbonate based on bisphenol A, the homopolycarbonate based on 1,1-bis(4-hydroxyphenyl)-3,3,5-trimethylcyclohexane, 4,4'-dihydroxybiphenyl, and the copolycarbonates based on the two monomers bisphenol A and 1,1-bis(4-hydroxyphenyl)-3,3,5-trimethylcyclohexane and also homo- or copolycarbonates derived from the diphenols of formulae (I), (II) and (III)

(I)

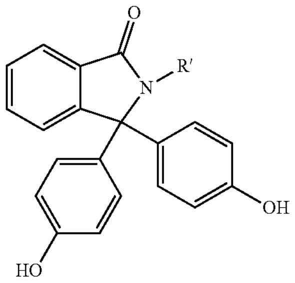

(II)

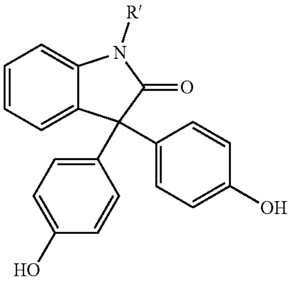

(III)

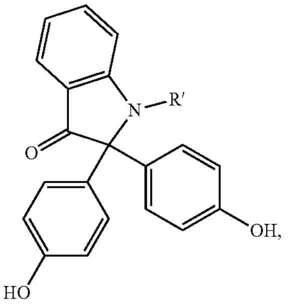

in which R' in each case stands for $C_1$- to $C_4$-alkyl, aralkyl or aryl, preferably for methyl or phenyl, very particularly preferably for methyl.

Preferred are also polycarbonates for the production of which dihydroxyaryl compounds of the following formula (1a) have been used:

(1a)

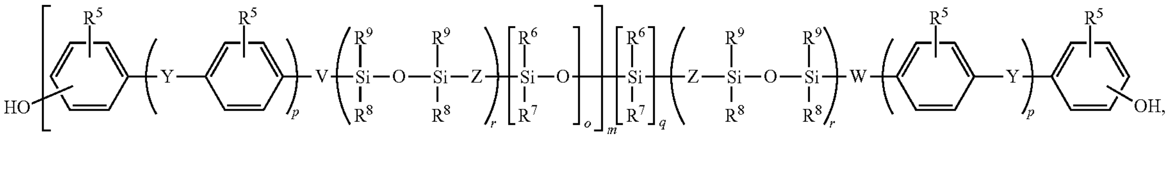

wherein $R_5$ stands for hydrogen or $C_1$- to $C_4$-alkyl, $C_1$- to $C_4$-alkoxy, preferably for hydrogen or methyl or methoxy particularly preferably for hydrogen, $R^6$, $R^7$, $R^8$ and $R^9$ mutually independently stand for $C_6$- to $C_{12}$-aryl or $C_1$- to $C_4$-alkyl, preferably phenyl or methyl, in particular for methyl, Y stands for a single bond, $SO_2$—, —S—, —CO—, —O—, $C_1$- to $C_6$-alkylene, $C_2$- to $C_5$-alkylidene, $C_6$- to $C_{12}$-arylene, which can optionally be condensed with further aromatic rings containing hetero atoms, or for a $C_5$- to $C_6$-cycloalkylidene residue, which can be singly or multiply substituted with $C_1$- to $C_4$-alkyl, preferably for a single bond, —O—, isopropylidene or for a $C_5$-to $C_6$-cycloalkylidene residue, which can be singly or multiply substituted with $C_1$- to $C_4$-alkyl, V stands for oxygen, $C_2$- to $C_6$-alkylene or $C_3$- to $C_6$-alkylidene, preferably for oxygen or $C_3$-alkylene, p, q and r mutually independently each stand 0 or 1, if q=0, W is a single bond, if q=1 and r=0 is, W stands for —O—, $C_2$- to $C_6$-alkylene or $C_3$- to $C_6$-alkylidene, preferably for —O— or $C_3$-alkylene, if q=1 and r=1, W and V mutually independently stand for $C_2$- to $C_6$-alkylene or $C_3$- to $C_6$-alkylidene, preferably for $C_3$ alkylene, Z stands for $C_1$- to $C_6$-alkylene, preferably $C_2$-alkylene, stands for an average number of repeating units from 10 to 500, preferably 10 to 100 and m stands for an average number of repeating units from 1 to 10, preferably 1 to 6, particularly preferably 1.5 to 5.

It is also possible to use dihydroxyaryl compounds, in which two or more siloxane blocks of general formula (1a) are linked via terephthalic acid and/or isophthalic acid under formation of ester groups.

Especially preferable are (poly)siloxanes of the formulae (2) and (3)

(2)

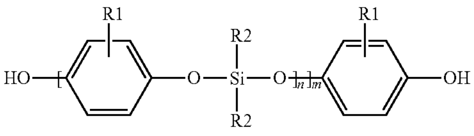

(3)

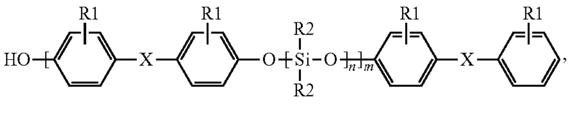

wherein $R^1$ stands for hydrogen, $C_1$- to $C_4$-alkyl, preferably for hydrogen or methyl and especially preferably for hydrogen, $R^2$ mutually independently stand for aryl or alkyl, preferably for methyl, X stands for a single bond, —$SO_2$—, —CO—, —O—, —S—, $C_1$- to $C_6$-alkylene, $C_2$- to $C_5$-alkylidene or for $C_6$- to $C_{12}$-arylene, which can optionally be condensed with further aromatic rings containing hetero atoms, X stands for a single bond, —$SO_2$—, —CO—, —O—, —S—, $C_1$- to $C_6$-alkylene, $C_2$- to $C_5$-alkylidene, $C_5$- to $C_{12}$-cycloalkylidene or for $C_6$- to $C_{12}$-arylene, which can optionally be condensed with further aromatic rings containing hetero atoms, X preferably stands for a single bond, isopropylidene, $C_5$- to $C_{12}$-cycloalkylidene or oxygen, and especially preferably stands for isopropylidene, n means an average number from 10 to 400, preferably 10 and 100, especially preferably 15 to 50 and m stands for an average number from 1 to 10, preferably 1 to 6 and especially preferably from 1.5 to 5.

Also preferably the siloxane block can be derived from one of the following structures:

(IV)

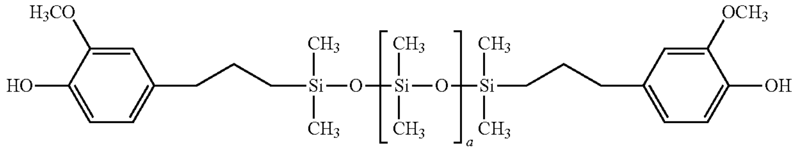

(V)

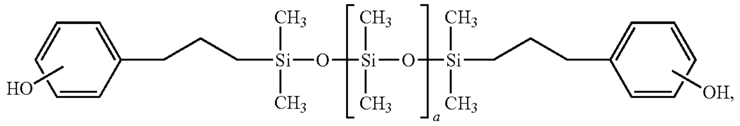

(Va)

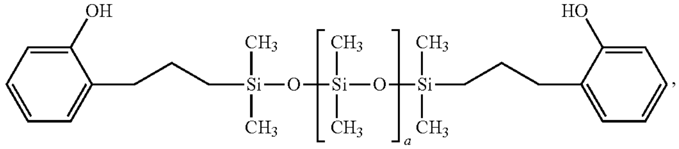

, or (VI)

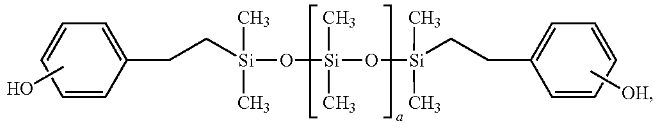

wherein a in formulae (IV), (V) and (VI) means an average number from 10 to 400, preferably from 10 to 100 and especially preferably from 15 to 50.

It is equally preferable, that at least two of the same or different siloxane blocks of the general formulae (IV), (V) or (VI) are linked via terephthalic acid and/isophthalic acid under formation of ester groups.

It is also preferable, if p=0 in formula (1a), V stands for $C_3$-alkylene, if r=1, Z stands for $C_2$-alkylene, $R^8$ and $R^9$ stand for methyl, if q=1, W stands for $C_3$-alkylene, if m=1, $R^5$ stands for hydrogen or $C_1$- to $C_4$-alkyl, preferably for hydrogen or methyl, $R^6$ and $R^7$ mutually independently stand for $C_1$- to $C_4$-alkyl, preferably methyl, and o stands for 10 to 500.

Copolycarbonates with monomer units of the general formula (1a), in particular with bisphenol A, and in particular the production of those copolycarbonates are described in WO 2015/052106 A2.

Polycarbonate materials are also materials comprising polycarbonate, the term "polycarbonate" including polyestercarbonates, together with other thermoplastic polymers, so called "polycarbonate blends", as long as these comprise at least 50 wt.-%, more preferably at least 60 wt.-% polycarbonate. Polymers, often combined with polycarbonate to give polycarbonate blends, are in particular impact modifiers or thermoplastic polyesters.

It is preferable that the impact modifier IM is one or more graft polymers of

IM.1 from 5 to 95% by weight, preferably from 30 to 90% by weight, of at least one vinyl monomer on IM.2 from 95 to 5% by weight, preferably from 70 to 10% by weight, of at least one graft base selected from the group consisting of diene rubbers, EP(D)M rubbers (i.e. rubbers based on ethylene/propylene and optionally diene), acrylate rubbers, polyurethane rubbers, silicone rubbers, silicone acrylate rubbers, chloroprene rubbers and/or ethylene/vinyl acetate rubbers.

It is preferable that the median particle size ($d_{50}$ value) of the graft base IM.2 is from 0.05 to 10 μm, with preference from 0.1 to 5 μm, particularly from 0.2 to 0.4 μm. The $D_{50}$ value can be determined via ultracentrifuge measurement (W. Scholtan, H. Lange, Kolloid, Z. and Z. Polymere 250 (1972), 782-796). The $D_{50}$ value is the diameter above and below which 50% by weight of the particles respectively lie.

Monomers IM.1 are preferably mixtures of

IM.1.1 from 50 to 99 parts by weight of vinylaromatics and/or ring-substituted vinylaromatics (such as styrene, α-methylstyrene, p-methylstyrene, p-chlorostyrene) and/or $C_1$- to $C_8$-alkyl (meth)acrylates, such as methyl methacrylate, ethyl methacrylate), and IM.1.2 from 1 to 50 parts by weight of vinyl cyanides (unsaturated nitriles, such as acrylonitrile and methacrylonitrile) and/or $C_1$- to $C_8$-alkyl (meth)acrylates, such as methyl methacrylate, n-butyl acrylate, tert-butyl acrylate, and/or derivatives (such as anhydrides and imides) of unsaturated carboxylic acids, for example maleic anhydride and N-phenylmaleimide.

Preferred monomers IM.1.1 are those selected from at least one of the monomers styrene, α-methylstyrene and methyl methacrylate, and preferred monomers IM.1.2 are those selected from at least one of the monomers acrylonitrile, maleic anhydride and methyl methacrylate. Particularly preferred monomers are IM.1.1 styrene and IM.1.2 acrylonitrile.

Preferred graft bases IM.2 are silicone acrylate rubbers, diene rubbers (for example those based on butadiene and isoprene) and mixtures of diene rubbers. For the purposes of the invention, the term diene rubbers also covers copolymers of diene rubbers or of mixtures of these with other copolymerizable monomers (e.g. as per IM.1.1 and IM.1.2).

The glass transition temperature $T_g$ of the graft bases IM.2 is generally <10° C., preferably <0° C., particularly preferably <−10° C., determined by using differential scanning calorimetry (DSC) in accordance with the standard ISO 11357-2:2014-07 at heating rate 10 K/min, where $T_g$ is defined as midpoint temperature (tangent method).

The gel content of the graft base IM.2 is preferably at least 20% by weight, and in the case of graft bases IM.2 produced by the emulsion polymerization process preferably at least 40% by weight, determined at 25° C. in toluene (M. Hoffmann, H. Krömer, R. Kuhn, Polymeranalytik I and II [Polymer analysis I and II], Georg Thieme-Verlag, Stuttgart 1977).

It is preferable that the graft polymer made of components IM.1 and IM.2 has a core-shell structure where component IM.1 forms the shell and component IM.2 forms the core; (see by way of example Ullmann's Encyclopedia of Industrial Chemistry, VCH-Verlag, Vol. A21, 1992, page 635 and page 656).

The graft copolymers IM are produced by free-radical polymerization, for example by emulsion, suspension, solution or bulk polymerization, preferably by emulsion or bulk polymerization. Because, as is known, the graft monomers are not necessarily entirely grafted onto the graft base during the grafting reaction, the expression graft polymers IM according to the invention also covers products which are obtained via (co)polymerization of the graft monomers in the presence of the graft base and which arise concomitantly during work-up.

Suitable acrylate rubbers as per IM.2 of the polymers IM are preferably polymers of alkyl acrylates, if appropriate with up to 40% by weight, based on IM.2, of other polymerizable, ethylenically unsaturated monomers. Among the preferred polymerizable acrylic esters are $C_1$- to $C_8$-alkyl esters, such as methyl, ethyl, butyl, n-octyl and 2-ethylhexyl esters; haloalkyl esters, preferably halo-$C_1$- to $C_8$-alkyl esters, such as chloroethyl acrylate, and also mixtures of these monomers.

Monomers having more than one polymerizable double bond can be copolymerized for crosslinking purposes. Preferred examples of crosslinking monomers are esters of unsaturated monocarboxylic acids having from 3 to 8 carbon atoms and of unsaturated monohydric alcohols having from 3 to 12 carbon atoms, or of saturated polyols having from 2 to 4 OH groups and from 2 to 20 carbon atoms, e.g. ethylene glycol dimethacrylate, allyl methacrylate; polyunsaturated heterocyclic compounds, e.g. trivinyl and triallyl cyanurate; polyfunctional vinyl compounds, such as di- and trivinylbenzenes; and also triallyl phosphate and diallyl phthalate. Preferred crosslinking monomers are allyl methacrylate, ethylene glycol dimethacrylate, diallyl phthalate and heterocyclic compounds which have at least three ethylenically unsaturated groups. Particularly preferred crosslinking monomers are the cyclic monomers triallyl cyanurate, triallyl isocyanurate, triacryloylhexahydro-s-triazine, triallylbenzenes. The quantity of the crosslinked monomers is preferably from 0.02 to 5% by weight, in particular from 0.05 to 2% by weight, based on the graft base IM.2. In the case of cyclic crosslinking monomers having at least three ethylenically unsaturated groups, it is advantageous to restrict the quantity to less than 1% by weight of the graft base IM.2.

Examples of preferred "other" polymerizable, ethylenically unsaturated monomers which can optionally serve alongside the acrylic esters for production of the graft base IM.2 are acrylonitrile, styrene, α-methylstyrene, acrylamides, vinyl $C_1$- to $C_6$-alkyl ethers, methyl methacrylate, butadiene. Preferred acrylate rubbers as graft base IM.2 are emulsion polymers having at least 60% by weight gel content.

Suitable silicone rubbers as per IM.2 can be produced via emulsion polymerization, as described by way of example in U.S. Pat. Nos. 2,891,920 and 3,294,725. Other suitable graft bases as per IM.2 are silicone rubbers having graft-active sites, as described in DE3 704 657 A1, DE 3 704 655 A1, DE 3 631 540 A1 and DE 3 631 539 A1.

Silicone acrylate rubbers are also suitable as graft bases IM.2 according to the invention. The said silicone acrylate rubbers are composite rubbers having graft-active sites comprising from 10 to 90% by weight of silicone rubber content and from 90 to 10% by weight of polyalkyl (meth) acrylate rubber content, where the two rubber components mentioned penetrate into one another in the composite rubber in such a way that they cannot be substantially separated from one another. If the content of the silicone rubber component in the composite rubber is too high, the finished resin compositions have disadvantageous surface properties and are less easy to colour. If, in contrast, the content of the polyalkyl (meth)acrylate rubber component in the composite rubber is too high, the impact resistance of the finished resin composition is adversely affected.

Silicone acrylate rubbers are known and are described by way of example in U.S. Pat. No. 5,807,914, EPA2 430134 and U.S. Pat. No. 4,888,388. It is preferable to use a graft polymer produced by emulsion polymerization where IM.1 is methyl methacrylate and IM.2 is silicone acrylate composite rubber.

Suitable blend partner for polycarbonates are also polyesters, in particular polyalkylene terephthalates or mixtures of polyalkylene terephthalates.

Preferably, the polyesters are reaction products of terephthalic acid or reactive derivatives thereof, such as dimethyl esters or anhydrides, and aliphatic, cycloaliphatic or araliphatic diols and also mixtures of these reaction products. The polyalkylene terephthalates thus contain structural units derived from terephthalic acid and aliphatic, cycloaliphatic or araliphatic diols.

In the context of the present invention polyalkylene terephthalates is to be understood as also including polyesters which contain not only terephthalic acid radicals but also proportions of further dicarboxylic acids in an amount of up to 50 mol %, preferably up to 25 mol %. These may contain for example aromatic or cycloaliphatic dicarboxylic acids having 8 to 14 carbon atoms or aliphatic dicarboxylic acids having 4 to 12 carbon atoms, for example phthalic acid, isophthalic acid, naphthalene-2,6-dicarboxylic acid, 4,4'-biphenyldicarboxylic acid, succinic acid, adipic acid and cyclohexanedicarboxylic acid. It is preferable to employ only terephthalic acid and isophthalic acid.

Diols employed in the production of the polyalkylene terephthalates according to the invention include for example ethylene glycol, butane-1,4-diol, propane-1,3-diol, tetramethylcyclobutanediol, isosorbitol, 2-ethylpropane-1,3-diol, neopentyl glycol, pentane-1,5-diol, hexane-1,6-diol, cyclohexane-1,4-dimethanol, 3-ethylpentane-2,4-diol, 2-methylpentane-2,4-diol, 2,2,4-trimethylpentane-1,3-diol, 2-ethylhexane-1,3-diol, 2,2-diethylpropane-1,3-diol, hexane-2,5-diol, 1,4-di(β-hydroxyethoxy)benzene, 2,2-bis(4-hydroxycyclohexyl)propane, 2,4-dihydroxy-1,1,3,3-tetramethylcyclobutane, 2,2-bis(4-(β-hydroxyethoxyphenyl)propane and 2,2-bis(4-hydroxypropoxyphenyl)propane and mixtures thereof (DE2 407 674 A, DE 2 407 776 A, DE 2 715 932 A).

Common names of these polyalkylene terephthalates are for example PET, PBT, PETG, PCTG, PEICT, PCT or PTT.

Preferred polyalkylene terephthalates contain at least 80% by weight, preferably at least 90% by weight, based on the dicarboxylic acid component of terephthalic acid radicals and at least 80% by weight, preferably at least 90% by weight, based on the diol component of ethylene glycol and/or butane-1,4-diol radicals.

The polyalkylene terephthalates may be branched through incorporation of relatively small amounts of tri- or tetrahydric alcohols or tri- or tetrabasic carboxylic acids, for example according to DE 1 900 270 A and U.S. Pat. No. 3,692,744 B. Examples of preferred branching agents are trimesic acid, trimellitic acid, trimethylolethane and trimethylolpropane, and pentaerythritol. Particular preference is given to polyalkylene terephthalates which have been produced solely from terephthalic acid and the reactive derivatives thereof (e.g. the dialkyl esters thereof) and ethylene glycol and/or butane-1,4-diol, and to mixtures of these polyalkylene terephthalates.

The preferably employed polyalkylene terephthalates preferably have an intrinsic viscosity of 0.52 dl/g to 0.95 dl/g, particularly preferably 0.56 dl/g to 0.80 dl/g, very particularly preferably 0.58 dl/g to 0.68 dl/g. To determine intrinsic viscosity, the specific viscosity in dichloroacetic acid is first measured in a concentration of 1% by weight at 25° C. according to ISO 1628-5:1998-03 in an Ubbelohde viscometer. The determined intrinsic viscosity is then calculated from the measured specific viscosity×0.0006907+0.063096 (× indicates multiplication). The polyalkylene terephthalates having the preferred intrinsic viscosity achieve an advantageous balance of mechanical and rheological properties in the compositions according to the invention.

The polyalkylene terephthalates may be produced by known methods (see, for example, Kunststoff-Handbuch, volume VIII, p. 695 et seq., Carl-Hanser-Verlag, Munich 1973).

To achieve incorporation of additives, such as flame retardants, antistats, UV absorbers, stabilizers, for example heat stabilizers, mould release agents, flow improvers and antioxidants, scattering agents, reinforcing agents, colouring agents such as dyes and pigments, thermally conductive fillers etc. into the polycarbonate material, the polycarbonate or polycarbonate blend is preferably employed in the form of powders, pellets or mixtures of powders and pellets.

Although polycarbonate is the material of choice for the substrate layers of back and front cover as well as of the functional components, where possible, in principle analogue concepts for other thermoplastic materials could be realized as well. Other thermoplastic materials are, e.g., materials based on polystyrene, styrene copolymers, aromatic polyesters such as polyethylene terephthalate (PET), PET-cyclohexanedimethanol copolymer (PETG), polyethylene naphthalate (PEN), polybutylene terephthalate (PBT), cyclic polyolefin, polybutylene succinate (PBS), poly- or copolyacrylates, and poly- or copolymethacrylate, e.g. poly- or copolymethyl methacrylates (such as PMMA), polyamides (preferably polyamide 6 (PA6) and polyamide 6,6 (PA6,6)), and also copolymers with styrene, e.g. transparent polystyrene-acrylonitrile (PSAN), thermoplastic polyurethanes, polymers based on cyclic olefins (e.g. TOPAS®, a product commercially available from Ticona), and mixtures of the polymers mentioned. “Based on” in this context means a portion of at least 50 wt.-% of the respective polymer in the thermoplastic material. Polycarbonate, however, is the material of choice due to its excellent properties and versatile possible characteristic profiles. Due to this, most parts of a housing assembly can be realized by using polycarbonate based materials only. This is a unique qualification. Polycarbonate materials are available which are transparent, opaque or translucent. High thermally conductive and low thermally conductive materials and those which are not thermally conductive at all are available.

If surface modifications of the housing assembly are needed for a more attractive design, nanostructuring or microstructuring of one or more elements of the outside of the housing is preferable, e.g. of the front cover or the back cover or part of the front cover or part of the back cover or of the entire outer surface of the housing, as well as other alternatives of surface design which do not alter the surface of the respective cover part in that another material is brought to the surface which would have to be removed by scraping off etc. before the cover part could be recycled. Such additional steps would make recycling more energy and cost-consuming and would reduce the recyclable share of the entire material of the housing assembly.

Nanostructuring and microstructuring lead to a 3-dimensionally-structured surface. A “3-dimensionally-structured surface” is understood to be patterns, textures and grains, which have a specifically introduced arrangement and distribution of single structural elements, which result in a visual impression of an optical design for the observer. The structural elements preferably have a width of at least 10 nm, more preferably 10 to 500 μm. The width values refer to the smallest width of a structural element. The structural elements preferably have a height of at least 5 μm to 100 μm, more preferably 10 μm to 500 μm. The height is the maximum vertical distance between the maximum and the minimum of the structural element. The maxima of adjacent structural elements, i.e. directly neighbouring structural elements, comprise a spacing of 5 μm to 500 μm, more preferably 70 μm to 250 μm, particularly preferably 100 μm to 200 μm. The surface is preferably structured via injection compression moulding or during the injection moulding step.

A possible alternative for altering the surface appearance, i. e. the optical appearance and/or haptics, is the use of an additional layer or a multi-layer element with the desired surface appearance, with regard to optical appearance and/or haptical appearance, which is attached to the substrate layer of the front cover or the back cover via one or more separable snap-fits, interference-fits, predetermined breaking points or screw connections that are fully detachable from front cover/back cover as described above, snap-fits and interference-fits being preferred, snap-fits being particularly preferred. Such additional multi-layer element may comprise, preferably consist of, a thermoplastic layer, preferably one made of a polycarbonate material, more preferably made of the same polycarbonate material as the substrate layer and a layer with a decorative effect such as a plating, an inlay, e.g. a wood, stone or leather inlay. Although such a multi-layer element cannot be recycled together with the main part, the substrate layer, of the front cover or back cover, at least not without any additional recycling step as, e.g. scrapping off, with the substrate layer, it can be easily separated from the substrate layer and either disposed or brought to more complex recycling steps than, e.g. mechanical recycling. A decor layer may also be a polycarbonate layer without any additional inlay, but wherein the decor layer is coloured or itself nanostructured or microstructured. Depending on the polycarbonate material used, such a layer may also be recycled together with the substrate layer of the front cover or of the back cover. If the polycarbonate material is similar to the one of the substrate layer of the respective cover to which it is attached, at least, if it can be recycled together with the respective substrate layer, there is even no need to use separable connection means, but if it has to be separated from the respective substrate layer, the connecting means as described can be used.

If the heatsink element is made from a material which is not a polycarbonate material, either made e.g. from another thermoplastic material or from metal, preferably if it is made from a material which is not the same polycarbonate material as that of the substrate layer of the back cover to which the heatsink element is attached, the heatsink element is also manually or automatedly without any breaking of material except from breaking at predetermined breaking points removable from the back cover and hence included in the group of “any other to the front cover and/or the back cover attached component which comprises a material which is not a polycarbonate material, preferably not the polycarbonate material of the front or back cover, [which is] manually without any breaking of material or via predetermined breaking points removable from the respective cover part.” The heatsink may be formed of metal or another thermoplastic material or be a combination of both. It may also be formed from a polycarbonate material. Preferably, the heatsink is made from a thermoplastic material, more preferably from a high or low thermally conductive polycarbonate composition. If a polycarbonate material with low or high thermal conductivity is chosen, preferably depends on the heat generated by the one or more electric/electronic components. Such a thermoplastic composition, preferably the polycarbonate composition, further preferably contains expanded graphite, more preferably in an amount of at least 20 wt.-%, even more preferably in an amount of at least 30 wt.-%, based on the total weight of the composition. The polycarbonate material of the heatsink element may be the same polycarbonate material or a polycarbonate material different from the polycarbonate material of the substrate layer of the back cover. In the first case, a one-component injection moulding process can be used for the production of the back cover including the heatsink element. For the second case, a two-component injection moulding process may be used. Another way to produce the substrate layer of the back cover and the heatsink element if the polycarbonate material of both components is not the same, is producing the substrate layer via an injection moulding process, the heatsink element, which may be part of an additional layer, in a separate injection moulding process and attaching both components to each other by a snap-fit, an interference-fit or a screw connection.

Depending on the materials used for the front cover and the back cover, these parts can be recycled together. This is of course the case, where the material of the substrate layer of the front cover is exactly the same as that of the substrate layer of the back cover. There are also cases where the front cover has to be recycled separately from the back cover. This might, e.g be the case, where a certain polycarbonate blend material is used for the substrate layer of the front cover and a not-blend polycarbonate material for the substrate layer of the back cover.

Preferably, the front cover comprises a substrate layer formed from a polycarbonate material with an in-plane thermal conductivity of less than 1.5 W/(m·K), as determined in accordance with ASTM 1461-01(2001), a relative dielectric constant (Dk) of less than 5.0, as determined in accordance with IEC 61189-2-721:2015 with the SPDR (split postdielectric resonator) method at a frequency of 5.0 GHz, and a surface resistance of greater than $10^{11}\Omega$, as determined in accordance with ISO 3915-1999.

The substrate layer of the front cover preferably has a thickness of 0.8 to 1.5 mm, more preferably of 1.0 to 1.4 mm Thickness with regard to the substrate layer of the front cover or of the substrate layer of the back cover as well as of any other layer which might be part of the respective cover means layer thickness perpendicular to the surface of the layer in each point in which no additional component is integrally formed thereon, wherein the mentioned thickness is given for at least 60%, preferably for at least 75%, more preferably for at least 90% of the respective surface area of the respective layer, particularly preferably for the entire surface.

Preferably, the substrate layer of the front cover has a flame retardant rating of at least HB, further preferred of at least V1, particularly preferably of at least V0, as determined according to DIN EN 60695-11-10:2014-10 at its respective thickness.

Preferably, the polycarbonate material used for the substrate layer of the back cover is moulded from a composition having an in-plane thermal conductivity of 0.25 to 10 W/(m·K), more preferably 0.5 to 10 W/(m·K), even more preferably 1 to 4 W/(m·K), particularly preferred 1 to 1.5 W(m·K), determined according to ASTM E1461-01. The polycarbonate composition of the substrate layer of the back cover preferably comprises 50 to 90 wt.-%, more preferably 50 to 80 wt.-%, even more preferably 55 to 80 wt.-%, of aromatic polycarbonate, the same or a different polycarbonate as in the polycarbonate material of the substrate layer of the front cover, and 10 to 50 wt.-%, more preferably 20 to 50 wt.-%, even more preferably 20 to 45 wt.-%, of a thermally conductive filler, both amounts referring to the total weight of the polycarbonate composition.

If a polycarbonate material with a high thermal conductivity is used for the substrate layer of the back cover, e.g. a material with a thermal conductivity of 4 to 40 W/(m·K), preferably 6 to 18 W/(m·K), determined according to ASTM E1461-01, —which in general means 30-40 wt.-% of thermally conductive filler, preferably expanded graphite—and a snap-fit is used for the connection of the front cover with the back cover, preferably the back cover is the part comprising the snap-in area(s) and the front cover is the part comprising the snap-fit hooks.

The thermally conductive filler used in the polycarbonate material of the substrate layer of the back cover preferably is selected from the group consisting of magnesium hydroxide, talc, boehmite aluminum hydroxide, diaspore aluminum hydroxide, gibbsite aluminum hydroxide, calcium carbonate, mica, barium oxide, barium sulfate, calcium silicate, zirconium oxide, silicon oxide, glass beads, magnesium aluminum oxide, calcium magnesium carbonate, ceramic coated graphite, graphite, in particular expanded graphite, clay, and any mixture thereof. Particularly preferred, the thermally conductive filler used in the polycarbonate material of the substrate layer of the back cover is talc or expanded graphite, very particularly preferred talc.

The substrate layer of the back cover preferably has a thickness of 2 to 4 mm.

If a polycarbonate material or another thermoplastic material is used for the heatsink element, which are both better solutions compared to metal due to the lighter weight, the costs and possibly also for the recyclability of the housing assembly, although metal could also be used, the polycarbonate material may be one with a higher thermal conductivity than the material of the substrate layer of the back cover, more preferably at least 2 W/(m·K) higher, further preferred with an in-plane thermal conductivity of 4 to 40 W/(m·K), most preferably 6 to 18 W/(m·K), determined according to ASTM E1461-01.

The heatsink may also be integrally formed from the polycarbonate material of the substrate layer, a polycarbonate material comprising an expanded graphite being preferred in this case.

The polycarbonate material of the heatsink element preferably comprises 50 to 90 wt.-%, more preferably 60 to 80 wt.-%, even more preferably 60 to 70 wt.-%, of aromatic polycarbonate and 10 to 50 wt.-%, more preferably 20 to 40 wt.-%, even more preferably 30 to 40 wt.-%, of a thermally conductive filler.

The thermally conductive filler used in the polycarbonate material of the heatsink element preferably comprises, more preferably at least 50 wt.-%, even more preferably at least 80 wt.-%, most preferably is one of the following: a silicon nitride, an aluminum nitride, a boron nitride, a graphite, a ceramic filler, any mixture thereof, in particular an expanded graphite.

Preferably, the materials used for the front cover, the back cover and the heatsink all are polycarbonate materials, more preferably, the material used for at least one, preferably for more, more preferably used for all connecting means, at least the connecting elements directly attached to the front cover or back cover, connecting the components comprising a material which is not the material of the cover to which the component is attached to the respective cover part are polycarbonate materials.

Thermoplastic compositions, and here in particular polycarbonate compositions, can be brought into the desired shape by injection moulding processes, which is the preferred production process for the thermoplastic parts, as well as by additive manufacturing processes. The substrate layer and/or any additional layer of the front cover and/or the back cover as well as any component or any part of a component made from thermoplastic material may be produced by extrusion, hot press moulding, spinning, blow moulding, deep drawing, 3D printing or injection moulding processes, e.g. standard injection moulding, cascade injection moulding, sequential injection, multi-component injection moulding, injection compression moulding or film insert moulding, 3D printing and injection moulding being preferred, injection moulding being particularly preferred.

Injection moulding processes are known to those skilled in the art and described for example in "Handbuch Spritzgießen", Friedrich Johannnaber/Walter Michaeli, Munich; Vienna: Hanser, 2001, ISBN 3-446-15632-1 or in "Anleitung zum Bau von Spritzgießwerkzeugen", Menges/Michaeli/Mohren, Munich; Vienna: Hanser, 1999, ISBN 3-446-21258-2. Injection moulding is here to be understood as comprising all injection moulding processes including multicomponent injection moulding and injection-compression moulding processes. Injection-compression moulding processes differ from conventional injection moulding processes in that the injection and/or solidification procedure involves mould plate movement. In the known injection moulding process the mould plates are already opened slightly before the injection procedure to compensate for the shrinkage occurring during subsequent solidification and to reduce the required injection pressure. A pre-enlarged cavity is therefore already present at the beginning of the injection procedure. Flash faces of the mould ensure that the pre-enlarged cavity is still sufficiently leakproof even when the mould plates have been somewhat opened. The plastics composition is injected into this pre-enlarged cavity and is simultaneously/subsequently compressed as the mould moves towards the closed position. Particularly in the production of large surface area and thin-walled mouldings having long flow paths, the more complex injection-compression moulding technique is preferred or in some cases essential. A reduction of the injection pressures required for large mouldings is achieved only in this way. Furthermore, stresses/warpage in the injection moulded part arising from high injection pressures can be avoided by injection-compression moulding.

In a preferred embodiment, which is described in the not yet published international patent application PCT/EP2020/069718, the back cover comprises a first layer made from a first composition comprising 50 to 90 wt.-%, more preferably 60 to 80 wt.-%, even more preferably 60 to 70 wt.-%, of aromatic polycarbonate and 10 to 50 wt.-%, more preferably 20 to 40 wt.-%, even more preferably 30 to 40 wt.-%, of a first thermally conductive filler, both amounts referring to the total weight of the first composition, the first composition having a thermal conductivity of 4 to 40 W/(m·K), most preferably 6 to 18 W/(m·K). A second layer, the substrate layer, is placed on the outer surface of the first layer. Preferably, this substrate layer is moulded from a second composition comprising 50 to 90 wt.-%, more preferably 50 to 80 wt.-%, even more preferably 55 to 80 wt.-%, of aromatic polycarbonate, the same or a different polycarbonate as in the first composition, and 10 to 50 wt.-%, more preferably 20 to 50 wt.-%, even more preferably 20 to 45 wt.-%, of a thermally conductive filler, both amounts referring to the total weight of the second composition, the second composition having a thermal conductivity of 0.25 to 10 W/(m·K), further preferably 0.5 to 10 W/(m·K), most preferably 1 to 4 W/(m·K), the second layer being on that side of the first layer which is directed to the outer side of the housing. The side of the second layer which is directed to the inner of the housing being not fully covered, by the material of the first layer, wherein the thermal conductivity of the first composition is at least 2 W/(m·K) larger than the thermal conductivity of the second composition, wherein the thermal conductivities are measured in-plane according to ASTM E 1 461-01. The thermally conductive filler of the first composition preferably comprises, more preferably at least 50 wt.-%, even more preferably at least 80 wt.-%, more preferably is one of the following: a silicon nitride, an aluminum nitride, a boron nitride, a graphite, a ceramic filler, any mixture thereof, in particular an expanded graphite. The thermally conductive filler of the second composition preferably comprises one of the following, more preferably at least 50 wt.-%, even more preferably at least 80 wt.-%, most preferably is one of the following: magnesium hydroxide, a talc, a boehmite aluminum hydroxide, a diaspore aluminum hydroxide, a gibbsite aluminum hydroxide, a calcium carbonate, a mica, a barium oxide, a barium sulfate, a calcium silicate, a zirconium oxide, a silicon oxide, a glass beads, a magnesium aluminum oxide, a calcium magnesium carbonate, a ceramic coated graphite, a clay, any mixture thereof, in particular talc. The first layer comprises a heatsink element, preferably consisting of the first composition, integrally formed on that side which is directed to the inner of the housing assembly. The heatsink element may comprise fins or analogous elements which increase the surface of the heatsink element while requiring relatively little space for better heat transfer. The described embodiment uses a material with high thermal conductivity for the heatsink element and low thermal conductivity for the substrate layer, which provides a housing with good mechanical properties. A high thermally conductive housing part with high filler loading could have the disadvantage of high brittleness, which is avoided with the described combination of components. Particularly preferred, this embodiment also comprises a front cover with the following features: the front cover comprises a substrate layer formed from a polycarbonate material with an in-plane thermal conductivity of less than 1.5 W/(m·K), as determined in accordance with ASTM 1461-01(2001), a relative dielectric constant (Dk) of less than 5.0, as determined in accordance with IEC 61189-2-721:2015 with the SPDR (split postdielectric resonator) method at a frequency of 5.0 GHz, and a surface resistance of greater than $10^{11}\Omega$, as determined in accordance with ISO 3915-1999, this substrate layer preferably having a thickness of 0.8 to 1.5 mm More preferably, at least two functional components are integrated into this substrate layer. Preferably, the substrate layer of the front cover of the described embodiment has a flame retardant rating of at least V1, more preferably of V0 as determined according to DIN EN 60695-11-10:2014-10 at its respective thickness.

Such a back cover is preferably prepared with an injection moulding machine with one injection unit and two moulds each of which has one cavity, or one mould having two cavities, a first cavity for moulding the first layer while a second cavity for moulding the second layer. Accordingly, the housing part is preferably prepared according to the following steps: moulding the first layer with the first composition in the first cavity, transferring the first layer into the second cavity, and over-moulding the second layer with the second composition over the first layer in the second cavity by leaving at least one area of the first layer not being over-moulded with the second layer for being exposed to at least one heat source. The temperature for melting the first composition preferably is in the range of 260 to 330° C., more preferably 270 to 320° C., even more preferably 280 to 310° C., and the temperature for melting the second composition is in the range of 260 to 320° C., preferably 270 to 310° C., and most preferably 280 to 300° C.

Housing assemblies according to the invention are particularly useful in the EE&A sector, for example as housing assemblies for kitchen appliances, for automotive applications, for healthcare devices, for surgery devices, for smart home devices, e.g. smart hubs, for computers including laptops, for mobile phones, receivers, e.g. GPS receivers, transceivers, remote controls, lighting devices, e.g. head lamps, control electronics, router—WLAN or LAN—, wireless access points, electrical power sources. Such devices comprising a housing according to the invention, including the preferred embodiments, are also subject-matter of the invention.

Possible disassembly of the housing assembly after its service time preferably provides at least 70 wt.-%, more preferably at least 80 wt.-%, even more preferably at least 90 wt.-%, particularly preferably at least 95 wt.-% of the total material weight of polycarbonate material originally used in the housing available for recycling. Although such a large amount of material can be made available for recycling, also demanding functions as Wifi can be integrated into the housing assembly. Heat dissipation performance can fulfil the required needs due to the integrated heatsink. A rich surface appearance is possible.

EXAMPLES

Materials

All thermoplastic materials are dried in dry air at 120° C. for 4 hours before use.

Makrolon® TC8030

Makrolon® TC8030 is a linear, graphite-filled (35 wt.-% expanded graphite) polycarbonate based on bisphenol A, with an in-plane thermal conductivity according to ASTM E1461-13 (2013) of 14 W/(m·K). The product has a melt viscosity according to ISO 11443-A (2014) of 169 $cm^3/(10$ min), measured at 330° C. and 1000 $s^{-1}$. The product is obtainable from Covestro AG, Leverkusen. Parts composed of Makrolon® TC8030 can be injection moulded at a melt temperature of 325° C. and a mould temperature of 85° C.

Makrolon® TC110 FR

Makrolon® TC110 FR is a linear, talc-filled (25 wt.-% talc) polycarbonate based on bisphenol A, with an in-plane thermal conductivity according to ASTM E1461-13 (2013) of 0.8 W/(m·K). The product has a melt viscosity according to ISO 11443-A (2014) of 160 $cm^3$/(10 min), measured at 300° C. and 1000 $s^{-1}$. The product offers a good burning behavior in small wall thicknesses (DIN EN 60695-11-10: 2014-10: V-0 at 1.5 mm and V-1 at 1.0 mm). The product is obtainable from Covestro AG, Leverkusen. Parts composed of Makrolon® TC110 FR can be injection moulded at a melt temperature of 300° C. and a mould temperature of 85° C.

Makrolon® TC611

Makrolon® TC611 is a linear, graphite-filled (35 wt.-% expanded graphite) polycarbonate based on bisphenol A, with an in-plane thermal conductivity according to ASTM E1461-13 (2013) of 16 W/(m·K). The product has a melt viscosity according to ISO 11443-A (2014) of 160 $cm^3$/(10 min), measured at 330° C. and 1000 $s^{-1}$. The product is obtainable from Covestro AG, Leverkusen. Parts composed of Makrolon® TC611 can be injection moulded at a melt temperature of 320° C. and a mould temperature of 85° C.

Bayblend® FR3040

Bayblend® FR3040 is a flame-retardant polycarbonate/ABS blend for thin-wall applications. The product offers a good burning behavior in small wall thicknesses (DIN EN 60695-11-10:2014-10: V-0 at 0.75 mm and V-1 at 0.6 mm). The product has a melt volume-flow rate MVR according to ISO 1133-1:2011 of 17 $cm^3$/(10 min), measured at 240° C. under a 5 kg load. The product is obtainable from Covestro AG, Leverkusen. Parts composed of Bayblend® FR3040 can be injection moulded at a melt temperature of 260° C. and a mould temperature of 80° C.

Makrolon® FR6040

Makrolon® FR6040 is a non-reinforced, antimony-, chlorine- and bromine-free flame-retardant, UV-stabilized polycarbonate/polycarbonate siloxane copolymer blend. The product has a melt volume-flow rate MVR according to ISO 1133-1:2011 of 11 $cm^3$/(10 min), measured at 300° C. under a 1.2 kg load. The product offers a good burning behavior in small wall thicknesses (DIN EN 60695-11-10:2014-10: V-0 at 1.5 mm). The product is obtainable from Covestro AG, Leverkusen. Parts composed of Makrolon® FR6040 can be injection moulded at a melt temperature of 305° C. and a mould temperature of 90° C.

Lexan™ EXL9330

Lexan™ EXL9330 is an opaque, non-chlorinated, non-brominated flame retardant, UV-stabilized polycarbonate siloxane copolymer with a melt volume-flow rate MVR according to ISO 1133-1:2011 of 9 $cm^3$/(10 min), measured at 300° C. under a 1.2 kg load. The product offers a good burning behavior in small wall thicknesses (DIN EN 60695-11-10:2014-10: V-0 at 1.5 mm and V-1 at 0.8 mm). The product is obtainable from Sabic Innovative Plastics, Bergen op Zoom. Parts composed of Lexan™ EXL9330 can be injection moulded at a melt temperature of 305° C. and a mould temperature of 90° C.

Makrolon® 2608

Makrolon® 2608 is a linear polycarbonate based on bisphenol A. The product has a melt volume-flow rate MVR according to ISO 1133-1:2011 of 12 $cm^3$/(10 min), measured at 300° C. under a 1.2 kg load. The product is obtainable from Covestro AG, Leverkusen. Parts composed of Makrolon® 2608 can be injection moulded at a melt temperature of 310° C. and a mould temperature of 100° C.

Makrolon® 2407 in color 021182

Makrolon® 2407 in color 021182 is a translucent, UV-stabilized, easily demouldable, linear polycarbonate based on bisphenol A, with a melt volume-flow rate MVR according to ISO 1133-1:2011 of 19 $cm^3$/(10 min), measured at 300° C. under a 1.2 kg load. The product has a transmission Ty (D65, 10°) of 57% at 2 mm, and a half-power angle of 50° at 2 mm, as measured in accordance with DIN EN ISO 13468-2:2006. The product is obtainable from Covestro AG, Leverkusen. Parts composed of Makrolon® 2407 can be injection moulded at a melt temperature of 300° C. and a mould temperature of 100° C.

Makrolon® LED5202

Makrolon® LED5202 is a transparent, UV-stabilized, linear polycarbonate based on bisphenol A, with a melt volume-flow rate MVR according to ISO 1133-1:2011 of 19 $cm^3$/(10 min), measured at 300° C. under a 1.2 kg load. The product has a transmission Ty (D65, 10°) of 90% at 2 mm, as measured in accordance with DIN EN ISO 13468-2:2006, and a haze of <0.5% at 2 mm, measured in accordance with ISO 14782 (1999). The product is obtainable from Covestro AG, Leverkusen. Parts composed of Makrolon® LED5202 can be injection moulded at a melt temperature of 280° C. and a mould temperature of 95° C.

SilFORT* PHC587C

SilFORT* PHC587C is a primerless, clear, non-yellowing siloxane resin hard coat, which provides improved protection against coating- and/or substrate-deterioration from weather and ultraviolet rays. The product is obtainable from Momentive Performance Materials GmbH, Leverkusen.

EXAMPLES

Example 1

A housing assembly for a GPS receiver comprising a front cover, a back cover with an integrated heatsink, and functional elements is prepared as follows:

The front cover includes snap-fit hooks as snap-fit elements positioned in the area of the front cover being in contact with the back cover in the closed state of the housing, so in the edge region of the front cover, which protrude towards the corresponding snap-in elements in the edge region of the back cover. These form the connecting means between the front cover and the back cover. The front cover further includes retaining structures on the inside of the front cover which act as snap-fit elements for a metal antenna fixed therein. This antenna can be easily separated from the front cover by pulling it out of the retaining structure. The front cover, including the integrally formed snap-fit hooks and retaining structures, is produced using Bayblend® FR3040 in an injection moulding process. An injection moulding mould with a structured surface on the wall of the mould that is representing the surface of the front cover that is directed to the outer of the housing assembly is used. This way a front cover with a structured outer surface for a more appealing design is produced. The back cover includes snap-fit hooks positioned on the surface of the substrate layer of the back cover which is directed to the inner of the housing. The snap-fit hooks protrude towards the inside of the housing. The back cover comprises snap-in areas for the snap-fit hooks of the front cover positioned in the area of the front cover being in contact with the back cover in the closed state of the housing, which is the edge region of the back cover. The back cover, including the integrally formed snap-fit hooks, is produced using Makrolon® TC8030 in an injection moulding process. A PCB is clicked into the back cover via the snap-fit hooks described above positioned on the surface of the back cover directed to the inner of the housing and corresponding snap-in areas in the PCB.

Example 2

A housing assembly for a light alarm clock comprising a front cover, a back cover with an integrated heatsink, and functional elements is prepared according to example 1 with the difference that the front cover produced in the injection moulding process comprises an opening and snap-in areas on its inner surface surrounding the opening. The opening receives a light window made of Makrolon® 2407 in colour 021182, which is equipped with snap-in hooks protruding towards the inside of the housing which form a snap-fit connection together with the snap-in areas of the opening. Additionally, the front cover comprises further snap-fit hooks positioned near the opening on the surface directed to the inner of the housing assembly which are used to click in an LED module by means of snap-in areas being part of the LED module. This LED module can thus be easily detached from the front cover and facilitates recycling of the front cover.

Example 3

A housing assembly for a WLAN router comprising a front cover, a back cover with an integrated heatsink, and functional elements is prepared according to example 1 with the difference that the front cover comprises an in-moulded light window. The front cover is thus produced via a two-component injection moulding process with transparent Makrolon® LED5202 being injected in the first shot to produce the light window, and Bayblend® FR3040 is injected in the second shot to form the remaining front cover. The transparent Makrolon® LED5202 used for the light window is a polycarbonate material as the material of the substrate layer (main layer) of the front cover. It can be easily recycled together with the material of the front cover. The front cover comprises snap-fit hooks positioned on the surface directed to the inner of the housing assembly which are used to click in an LED module as described in example 2.

Example 4

A housing assembly for a WLAN router comprising a front cover and a back cover, and functional elements is prepared as follows:

The back cover is produced by a two-component injection moulding process with Makrolon® TC110FR being injected in the first shot to produce the substrate layer of the back cover including snap-fit hooks positioned on the surface of the substrate layer which is directed to the inner of the housing. The snap-fit hooks protrude towards the inside of the housing. There are also snap-fit hooks as snap-fit elements positioned in the area of the back cover being in contact with the front cover in the closed state of the housing, so in the edge region of the back cover, which protrude towards the corresponding areas of the front cover. These form the connecting means between the front cover and the back cover. A heatsink is produced by injection of Makrolon® TC611 in the second shot, forming fin-shaped heat dissipation elements on the inner surface of the substrate layer of the back cover. A PCB is clicked into the back cover via the snap-fit hooks positioned on the surface of the back cover directed to the inner of the housing and corresponding snap-in areas in the PCB. The front cover includes snap-fit hooks positioned on the surface directed to the inner of the housing assembly. The snap-fit hooks protrude towards the inside of the housing. For the production of the front cover including the snap-fit hooks, Makrolon® TC110FR is used in an injection moulding process using a moulding tool which allows the production of snap-in areas for the snap-fit hooks positioned in the area of the back cover being in contact with the front cover in the closed state of the housing, which is the edge region of the front cover. An antenna is formed via laser activating plating (LAP) on a carrier plate made of Makrolon® 2608 which is clicked into the front cover via the snap-fit hooks on the surface of the front cover directed to the inner of the housing assembly and corresponding snap-in areas in the carrier plate in such a way that the side of the carrier plate on which the antenna is positioned is facing the inner surface of the front cover. For recycling purposes, this small carrier plate together with the antenna can be detached from the front cover and hence does not prevent the recycling of the front cover part.

Example 5

A housing assembly for a smart home hub comprising a front cover, a back cover, and functional elements is prepared as described according to example 4 with the difference that the heat sink produced by injection of Makrolon® TC611 in the second shot of the two-component injection moulding process forms an inner layer on the surface of the substrate layer of the back cover which is directed to the inner of the housing and further integrally formed fin-shaped heat dissipation elements on the surface of the inner layer which is directed to the inner of the housing. This configuration of the heat sink allows for improved heat dissipation.

Example 6

A housing assembly for a smart home hub comprising a front cover, a back cover, and functional elements is prepared as described according to example 4 with the difference that the substrate layer of the front cover having a thickness of 1.2 mm is provided with snap-in areas on the surface directed to the outer of the housing. These snap-in areas act as attachment means for a separate decor layer having a thickness of 1.0 mm which is clicked in via snap-fit hooks as snap-fit elements that are positioned on the surface of the decor layer directed to the inner of the housing. The decor layer including the described snap-fit hooks is produced in an injection moulding process using Makrolon® 2608 and subsequent coating using SilFORT* PHC587C. The dry PHC587C coating layer has a thickness of 8 μm. The decor layer provides the front cover of the housing with a scratch-resistant glossy design. As the decor layer can be easily detached by the separable snap-fits, the substrate layer of the front cover, which comprises most of the material of the front cover, can be recycled. Prior to the application of the coating, the decor layer part may be cleaned and deionized with deionized air. The application of the coating may be conducted by flow coating in a clean room at 23° C. and 50% relative humidity. After a flash-off time of 30 minutes the coating on the coated part should be cured for 1 hour at 130° C. To enable a dry coating thickness of 8 μm, the solid content of the coating material has to be adjusted to approximately 23.5 wt.-%.

Example 7

A housing assembly for an outdoor 5G antenna comprising a front cover, a back cover, and functional elements is prepared as follows:

The front cover includes snap-fit hooks as snap-fit elements positioned in the area of the front cover being in contact with the back cover in the closed state of the housing, so in the edge region of the front cover, which protrude towards the corresponding snap-in elements in the edge region of the back cover. These form the connecting means between the front cover and the back cover. There are also snap-fit hooks as snap-fit elements positioned on the surface of the front cover directed to the inner of the housing assembly. The snap-fit hooks protrude towards the inside of the housing. The front cover, including the integrally formed snap-fit hooks, is produced using Makrolon® FR6040 in an injection moulding process. An antenna is formed via laser activating plating (LAP) on a carrier plate made of Makrolon® 2608 which is clicked into the front cover via the snap-fit hooks on the surface of the front cover directed to the inner of the housing assembly and corresponding snap-in areas in the carrier plate in such a way that the side of the carrier plate on which the antenna is positioned is facing the inner surface of the front cover. For recycling purposes, this small carrier plate together with the antenna can be detached from the front cover and hence does not prevent the recycling of the front cover part. The back cover is produced by a two-component injection moulding process with Makrolon® TC8030 being injected in the first shot to produce the substrate layer of the back cover including snap-fit hooks positioned on the surface of the substrate layer which is directed to the inner of the housing. The snap-fit hooks protrude towards the inside of the housing. The back cover comprises snap-in areas for the snap-fit hooks of the front cover positioned in the area of the front cover being in contact with the back cover in the closed state of the housing, which is the edge region of the back cover. A heatsink is produced by injection of Makrolon® TC611 in the second shot, forming fin-shaped heat dissipation elements on the inner surface of the substrate layer of the back cover. A PCB is clicked into the back cover via the snap-fit hooks described above positioned on the surface of the back cover directed to the inner of the housing and corresponding snap-in areas in the PCB.

Example 8

A housing assembly for an outdoor 5G antenna comprising a front cover, a back cover, and functional elements is prepared as described according to example 4 with the difference that the front cover including the described snap-fit hooks and snap-in areas is produced in an injection moulding process using Lexan™ EXL9330.

Example 9

A housing assembly for a WLAN router comprising a front cover and a back cover, and functional elements is prepared as described in example 4 with the difference that instead of using the described snap-fit elements as connecting means between the front cover and the back cover, interference-fit elements are employed.

The back cover comprises integrally formed shafts as interference-fit elements positioned on the surface of the substrate layer that is directed to the inner of the housing assembly, which protrude towards the inner of the housing assembly. Correspondingly, the front cover comprises integrally formed hubs as interference-fit elements positioned on the surface of the substrate layer that is directed to the inner of the housing assembly, which receive the shafts of the back cover.

The invention claimed is:

1. A housing assembly comprising a back cover and a front cover, wherein the back cover and the front cover each comprise a substrate layer made from a same polycarbonate material or different polycarbonate materials, wherein the polycarbonate material of the substrate layer of the front cover comprises bisphenol A based homopolycarbonate, copolycarbonate of 1,1-bis(4-hydroxyphenyl)-3,3,5-trimethylcyclohexane and bisphenol A, polyestercarbonate, polycarbonate siloxane copolymer or a mixture thereof, and wherein a heatsink element is disposed on a side of the back cover which is directed to an interior of the housing, the heatsink element being in heat-conductive communication with at least one electronic component, wherein the back cover and the front cover are connected with each other and detachable from each other via one or more fasteners selected from the group consisting of snap-fits, interference-fits, screw-connections, and combinations thereof, formed from polycarbonate material, and/or one or more fasteners not formed from polycarbonate material, but which can be detached from the front and the back cover without any breaking of material or via predetermined breaking points, and/or one or more predetermined breaking points, and that the at least one electronic component and any other component attached to the front cover and/or to the back cover comprising a material which is not a polycarbonate material are removable from the respective cover part via snap-fit, interference-fit, screw connection or via breaking of a predetermined breaking point.

2. The housing assembly according to claim 1, wherein the front cover and the back cover are not connected by any connection means which comprise a material which is not the polycarbonate material of the front cover or the polycarbonate material of the back cover.

3. The housing assembly according to claim 2, wherein the connecting means between the front cover and the back cover are integrally formed from the material of the front cover, from the material of the back cover or from both materials.

4. The housing assembly according to claim 1, wherein any other to the front cover and/or to the back cover attached component which comprises a material which is not the polycarbonate material of the cover to which the component is attached is removable from the respective cover part via snap-fit, interference-fit or via breaking of a predetermined breaking point.

5. The housing assembly according to claim 1, wherein the heatsink element is manually or automatedly, without any breaking of material, except from predetermined breaking points, removable from the back cover.

6. The housing assembly according to claim 1, wherein the heatsink element is formed from a polycarbonate material.

7. The housing assembly according to claim 6, wherein the polycarbonate material of the heatsink element comprises expanded graphite.

8. The housing assembly according to claim 1, wherein the polycarbonate material of the substrate layer of the back cover comprises talc or expanded graphite.

9. The housing assembly according to claim 1, wherein the front cover and/or the back cover each do not comprise any additional layers other than the substrate layer made of polycarbonate material and, where applicable, in case of the back cover, a further layer made from polycarbonate material comprising the heatsink element integrally formed thereto.

10. The housing assembly according to claim 1, wherein the polycarbonate material of the substrate layer of the front cover and/or of the back cover comprises a flame retardant.

11. The housing assembly according to claim 1, wherein the back cover comprises a first layer molded from a first composition comprising 50 to 90 wt.-% of aromatic polycarbonate and 10 to 50 wt.-% of a first thermally conductive filler, both amounts referring to the total weight of the first composition, the first composition having a thermal conductivity of 4 to 40 W/(m·K) and a second layer as the substrate layer molded from a second composition comprising 50 to 90 wt.-% of aromatic polycarbonate, a same or a different polycarbonate as in the first composition, and 10 to 50 wt.-% of a thermally conductive filler, both amounts referring to the total weight of the second composition, the second composition having a thermal conductivity of 0.25 to 10 W/(m·K), the second layer being on a side of the first layer which is directed to an outer side of the housing, wherein the thermal conductivity of the first composition is at least 2 W/(m·K) larger than the thermal conductivity of the second composition, wherein the thermal conductivities are measured in-plane according to ASTM E1461-01, and wherein the first layer comprises a heatsink element integrally formed on a side which is directed to the inner of the housing assembly.

12. The housing assembly according to claim 1, wherein the housing assembly comprises a component different from the front cover, the back cover, the heatsink element or the at least one electronic component and which comprises a material which is not the polycarbonate material of the cover to which the component is attached.

13. The housing assembly according to claim 12, wherein one or more snap-fits are used for attachment of the component different from the front cover, the back cover, the heatsink element or the at least one electronic component and which comprises a material which is not the polycarbonate material of the cover to which the component is attached.

14. The housing assembly according to claim 1, consisting of the back cover and the front cover, the at least one heatsink element, the one or more electric/electronic components and optionally further functional components, wherein the back cover and the front cover each consist of the substrate layer made from the same polycarbonate material or different polycarbonate materials and optionally one or more additional layers which can be recycled together with the layer made from polycarbonate material, and wherein the at least one heatsink element is disposed on that side of the back cover which is directed to the interior of the housing, wherein the back cover and the front cover are connected with each other and detachable from each other via one or more fasteners selected from the group consisting of snap-fits, interference-fits and screw-connections, and combinations thereof, formed from polycarbonate material, and/or one or more fasteners not formed from polycarbonate material, but which can be detached from the front and the back cover without any breaking of material or via predetermined breaking points and/or one or more predetermined breaking points, and that the at least one electric/electronic component and any further functional component attached to the front cover and/or to the back cover comprising a material which is not a polycarbonate material are removable from the respective cover part via snap-fit, interference-fit, screw connection or via breaking of a predetermined breaking point.

* * * * *